United States Patent
Jain et al.

(10) Patent No.: US 11,177,093 B1
(45) Date of Patent: Nov. 16, 2021

(54) TOUCH-SENSITIVE MECHANICAL KEYBOARD WITH SENSING CIRCUITS FOR TOUCH EVENTS AND KEY DEPRESSION EVENTS

(71) Applicant: Apple Inc., Cupertino, CA (US)

(72) Inventors: Karan Jain, Cupertino, CA (US); William P. Yarak, III, San Francisco, CA (US); Chia Chi Wu, New Taipei (TW); Nicole Wells, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/655,159

(22) Filed: Oct. 16, 2019

Related U.S. Application Data

(60) Provisional application No. 62/737,809, filed on Sep. 27, 2018.

(51) Int. Cl.
*H01H 13/785* (2006.01)
*G06F 3/02* (2006.01)
*H01H 13/80* (2006.01)

(52) U.S. Cl.
CPC ........... *H01H 13/80* (2013.01); *G06F 3/0202* (2013.01); *H01H 13/785* (2013.01)

(58) Field of Classification Search
None
See application file for complete search history.

(56) References Cited

U.S. PATENT DOCUMENTS

| | | | |
|---|---|---|---|
| 2010/0253629 A1* | 10/2010 | Orsley | G06F 3/0202 345/168 |
| 2019/0294258 A1* | 9/2019 | Forlines | G06F 3/0235 |
| 2020/0026387 A1* | 1/2020 | Barel | G06F 3/044 |

* cited by examiner

*Primary Examiner* — Duane N Taylor, Jr.
(74) *Attorney, Agent, or Firm* — Kubota & Basol LLP

(57) ABSTRACT

This disclosure relates to touch-sensitive mechanical keyboards and methods for detecting touch events and key depression events on the touch-sensitive mechanical keyboard. The keypad can include a plurality of domes, a plurality of key make electrodes, first touch electrodes, and second touch electrodes. The first touch electrodes may be located underneath the plurality of key make electrodes, and the second touch electrodes may not. Both touch electrodes can detect touch events based on self-capacitance sensing. A key depression event can cause the key make electrode to make electrical contact with a corresponding first touch electrode, creating a short circuit that may cause the measured signal to saturate. The keyboard can include a plurality of sensing circuits coupled to the key make electrodes, the first touch electrodes, and the second touch electrodes. The plurality of sensing circuits can be used to detect both touch events and key depression events.

22 Claims, 14 Drawing Sheets

TOUCH-SENSITIVE MECHANICAL KEYBOARD WITH SENSING CIRCUITS FOR TOUCH EVENTS AND KEY DEPRESSION EVENTS

CROSS-REFERENCE TO RELATED APPLICATIONS

This application claims the benefit of U.S. Provisional Patent Application No. 62/737,809, filed Sep. 27, 2018, the disclosure of which is incorporated herein by reference in its entirety for all purposes.

FIELD

This disclosure relates generally to input devices and, more specifically, to touch-sensitive input devices.

BACKGROUND

Keyboards are widely used and are generally accepted as the preferred way to provide textual input to a computing system. These keyboards typically have mechanical keys that are arranged in the so-called QWERTY layout and are configured to move independently of one another and comply with standards for key spacing and actuation force.

One of the most common keyboard types is a "dome-switch" keyboard that works as follows. When a key is depressed, the key pushes down on a rubber dome sitting underneath the key. The rubber dome collapses, giving tactile feedback to the user depressing the key, and causes a conductive contact on the underside of the dome to touch a pair of conductive lines on a Printed Circuit Board (PCB) below the dome, thereby closing the switch. A chip in the keyboard emits a scanning signal along the pairs of lines on the PCB to all the keys. When the signal in one pair of the lines changes due to the contact, the chip generates a code corresponding to the key coupled to that pair of lines. This code is sent to the computer either through a keyboard cable or over a wireless connection where it is received and decoded into the appropriate key. The computer then decides what to do on the basis of the key depressed, such as display a character on the screen or perform some action. Other types of keyboards operate in a similar manner, with the main differences being how the individual key switches work. Some examples of other keyboards include capacitive-switch keyboards, mechanical-switch keyboards, Hall-effect keyboards, membrane keyboards, roll-up keyboards, and the like.

There have been numerous attempts made to introduce an alternative to the standard keyboard. The changes include, but are not limited to, non-QWERTY layouts, concave and convex surfaces, capacitive keys, split designs, membrane keys, etc. While such alternative keyboards may provide improved usability or ergonomics, they have failed to replace or duplicate the commercial success of the conventional mechanical keyboard.

SUMMARY

This disclosure relates to touch-sensitive mechanical keyboards and methods for detecting touch events and key depression events on the touch-sensitive mechanical keyboard. A touch event can be one where the user makes contact with a surface of the mechanical keys without applying sufficient downward force to depress the keycap. A key depression event can be one where the user applies sufficient downward to depress the keycap. The touch-sensitive mechanical keyboard can include a set of individually depressible mechanical keys having a touch-sensitive area located on their surface. A keypad can also be included within the keyboard to detect touch events and key depression events of one or more of the mechanical keys.

In some examples, the keypad can include a plurality of domes, a plurality of key make electrodes, first touch electrodes, and second touch electrodes. The first touch electrodes can be located underneath the plurality of key make electrodes. A key depression event can cause a key make electrode to make electrical contact with a corresponding first touch electrode, creating a short circuit that may cause the measured signal to saturate. The second touch electrodes may not be located underneath the plurality of key make electrodes and can detect touch events based on self-capacitance sensing. The first touch electrodes may, additionally or alternatively, detect touch events based on self-capacitance sensing. The keyboard can include a plurality of sensing circuits coupled to the key make electrodes, the first touch electrodes, and the second touch electrodes. The plurality of sensing circuits can be used to detect both touch events and key depression events.

In some examples, the touch-sensitive mechanical keyboard can include a processor for distinguishing detected touch events from detected key depressions. The touch-sensitive mechanical keyboard can advantageously allow users to enter textual input using a device having the same look and feel of a conventional keyboard while allowing the users to enter touch events without requiring the users to remove their hands from the keyboard. Methods for detecting touch events and key depressions are also disclosed.

DETAILED DESCRIPTION

In the following description of example examples, reference is made to the accompanying drawings in which it is shown by way of illustration specific examples that can be practiced. It is to be understood that other examples can be used and structural changes can be made without departing from the scope of the various examples.

This disclosure relates to touch-sensitive mechanical keyboards and methods for detecting touch events and key depression events on the touch-sensitive mechanical keyboard. A touch event can be one where the user makes contact with a surface of the mechanical keys without applying sufficient downward force to depress the keycap. A key depression event can be one where the user applies sufficient downward to depress the keycap. The touch-sensitive mechanical keyboard can include a set of individually depressible mechanical keys having a touch-sensitive area located on their surface. A keypad can also be included within the keyboard to detect touch events and key depression events of one or more of the mechanical keys.

In some examples, the keypad can include a plurality of domes, a plurality of key make electrodes, first touch electrodes, and second touch electrodes. The first touch electrodes can be located underneath the plurality of key make electrodes. A key depression event can cause a key make electrode to make electrical contact with a corresponding first touch electrode, creating a short circuit that may cause the measured signal to saturate. The second touch electrodes may not be located underneath the plurality of key make electrodes and can detect touch events based on self-capacitance sensing. The first touch electrodes may, additionally or alternatively, detect touch events based on self-capacitance sensing. The keyboard can include a plurality of sensing circuits coupled to the key make electrodes, the first touch electrodes, and the second touch electrodes. The plurality of sensing circuits can be used to detect both touch events and key depression events.

In some examples, the touch-sensitive mechanical keyboard can include a processor for distinguishing detected touch events from detected key depressions. The touch-sensitive mechanical keyboard can advantageously allow users to enter textual input using a device having the same look and feel of a conventional keyboard while allowing the users to enter touch events without requiring the users to remove their hands from the keyboard. Methods for detecting touch events and key depressions are also disclosed.

Figure 1:
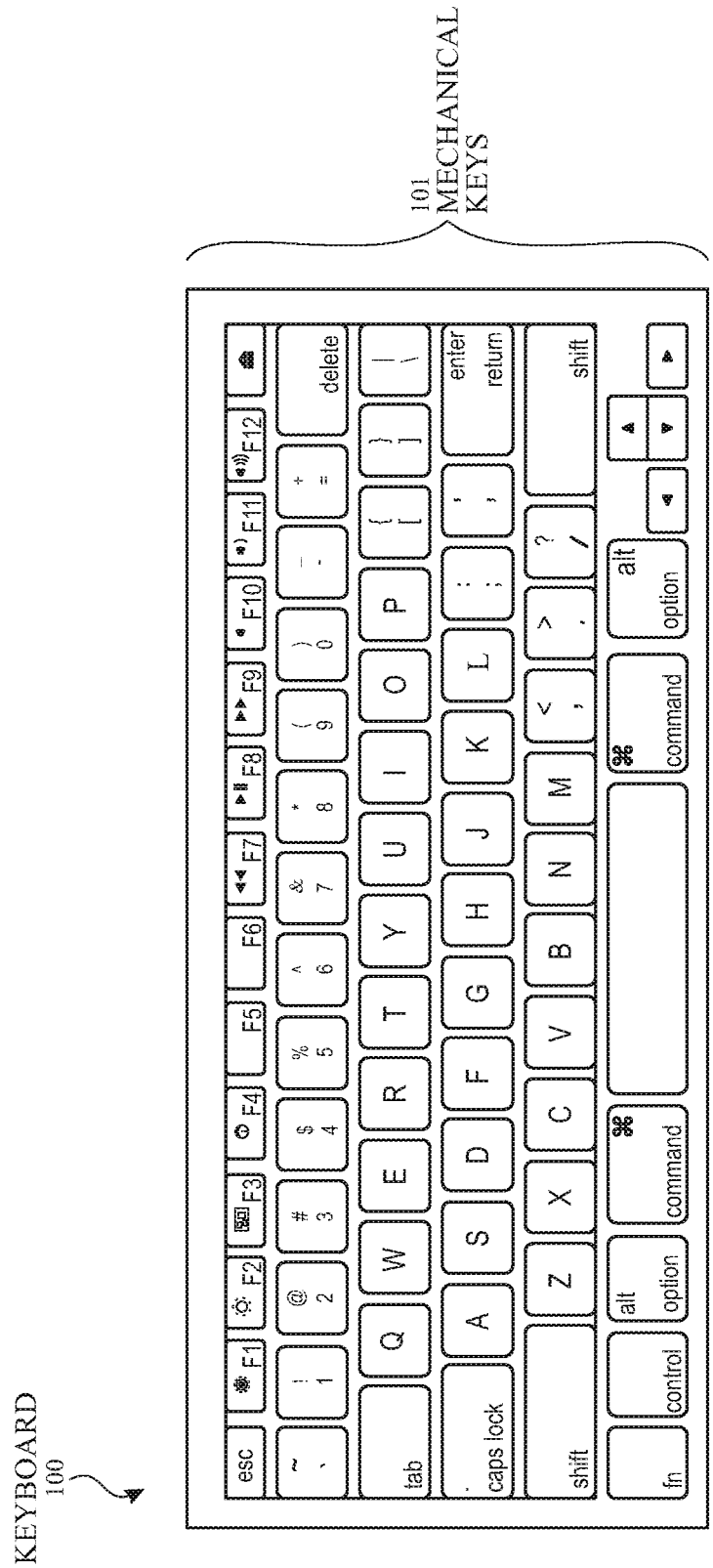
FIG. 1 illustrates a top view of an exemplary touch-sensitive mechanical keyboard according to examples of the disclosure.

FIG. 1 illustrates an exemplary touch-sensitive mechanical keyboard 100 having mechanical keys 101 and a touch-sensitive area located on the surfaces of the mechanical keys 101. In some examples, the keyboard 100 can be configured to have the look and feel of a conventional keyboard. For instance, each mechanical key 101 can be individually depressible, giving the user of the keyboard 100 tactile feedback associated with each depression of a mechanical key 101. The mechanical keys 101 can be used for text entry in a manner similar to a conventional keyboard. Additionally, the touch-sensitive area of the keyboard 100 can be used to detect touch events, such as taps or slides, on the surface of the mechanical keys 101. In this way, the keyboard 100 can also be used for cursor input functions, such as point, click, scroll, drag, select, zoom, and the like, without requiring the user to remove their hands from the keyboard 100. These functions, and more, can be driven by hand/finger motion, while the fingers are sliding over and touching the mechanical keys 101.

In some examples, the touch-sensitive area of the keyboard 100 can include the surfaces of all the mechanical keys 101. In other examples, the touch-sensitive area can include the surfaces of only a portion of the mechanical keys 101. By integrating multi-touch input capability into the keyboard 100 without altering its overall appearance or, more importantly, the familiar way in which it is used for typing, many of the benefits of multi-touch gesture-based input capability can be realized without having a negative impact on the user's text entry experience.

In some examples, the keyboard 100 can further include a flexible printed circuit (FPC) for coupling the keyboard 100 to a processor or host computer system. For example, the FPC can be used by the keyboard 100 to output information relating to the depression of one or more of the mechanical keys 101. Specifically, a signal indicating that one or more of the mechanical keys 101 that have been depressed can be transmitted through a key FPC to a processor. The FPC can also be used to output or receive information relating to a touch sensor included within the keyboard 100. For example, the keyboard 100 can include touch electrodes that sense touch events based on self-capacitive sensing. The FPC can be used to transmit touch signals detected by the touch sensor. In some examples, a single FPC can be used to transmit signals, which can indicate that one or more of the mechanical keys 101 have been depressed and that an object is touching or hovering over the surfaces of the mechanical keys 101.

While specific examples of the touch-sensitive mechanical keyboard 100 are provided above, it should be appreciated that the principals described in the present disclosure can similarly be applied to touch-sensitive mechanical keyboards having other features and configurations.

Figure 2:
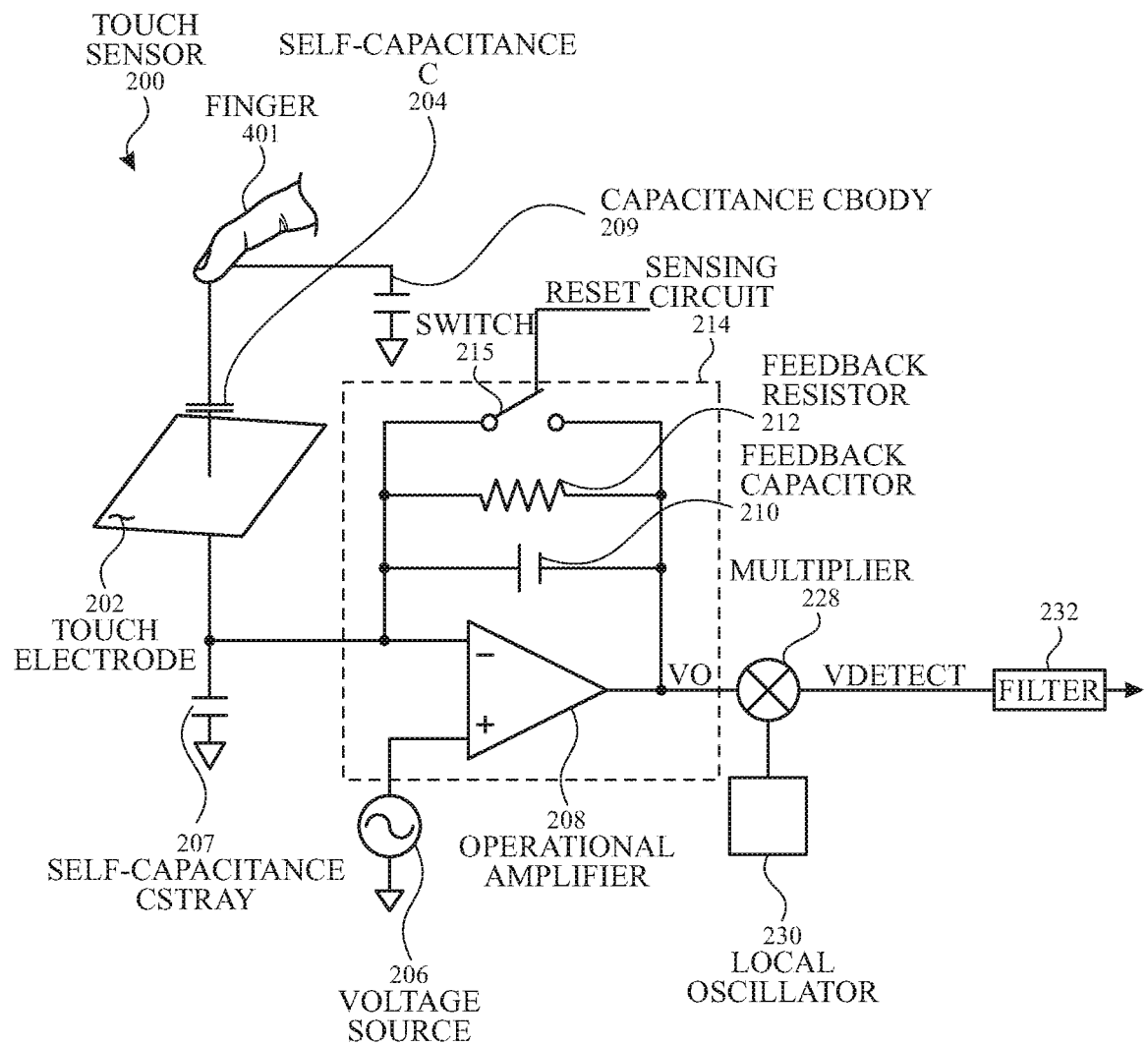
FIG. 2 illustrates an exemplary touch sensor circuit corresponding to a self-capacitance touch electrode and a sensing circuit according to examples of the disclosure.

FIG. 2 illustrates an exemplary touch sensor 200 corresponding to a self-capacitance touch electrode 202 and sensing circuit 214 according to examples of the disclosure. Touch electrode 202 can have an inherent self-capacitance Cstray 207 to ground associated with it, and also an additional self-capacitance C 204 to ground that is formed when an object, such as finger 401, is in proximity to or touching the touch electrode 202. The total self-capacitance to ground of the touch electrode 202 can be illustrated as capacitance C 204+Cstray 207. The finger 401 can have a capacitance Cbody 209 to ground. Note that Cbody 209 can typically be much larger than C 204 such that the total series capacitance of C 204 and Cstray 207 can be approximately C 204. The touch electrode 202 can be coupled to a sensing circuit 214. The sensing circuit 214 can include an operational amplifier 208, a feedback resistor 212, and a feedback capacitor 210, although other configurations can be employed. For example, the feedback resistor 212 can be replaced by a switched capacitor resistor in order to minimize parasitic capacitance effects that can be caused by a variable feedback resistor. In some examples, a switch 215 can be coupled across the feedback resistor 212 (e.g., in parallel with the feedback resistor 212 and/or the feedback capacitor 210), and the switch 215 can be controlled by signal RESET (e.g., the RESET signal can control whether the switch 215 is open or closed). By closing and opening the switch 215, the touch sensing system of the disclosure can dynamically change the feedback impedance of the sensing circuit 214, which can change its operational characteristics.

The operational amplifier 208 can have an inverting input (−) and a non-inverting input (+). The touch electrode 202 can be coupled to the inverting input (−) of the operational amplifier 208. An AC voltage source 206 (Vac) can be coupled to the non-inverting input (+) of the operational amplifier 208. As such, the touch sensor 200 can be configured to sense changes in the total self-capacitance 204 of the touch electrode 202 induced by the finger 401 or an object either touching or in proximity to the touch electrode 202. The output of the sensing circuit 214 Vo can be filtered and heterodyned or homodyned by being fed into a multiplier 228, where Vo can be multiplied with local oscillator 230 to produce Vdetect. Vdetect can be input into a filter 232. One skilled in the art will recognize that the placement of the filter 232 can be varied; thus, the filter can be placed after the multiplier 228, as illustrated, or two filters can be employed: one before the multiplier 228 and one after the multiplier 228. In some examples, the touch sensor 200 may not include a filter at all. The direct current (DC) portion of Vdetect can be used, e.g., by a processor, to determine if a touch or proximity event has occurred. A touch event can include proximity (i.e., hover) events. Note that while FIG. 2 indicates the demodulation at the multiplier 228 occurs in the analog domain, the output Vo may be digitized by an analog-to-digital converter (ADC), and the multiplier 228, the filter 232, and the local oscillator 230 may be implemented in a digital fashion (e.g., 228 can be a digital demodulator, 232 can be a digital filter, and 230 can be a digital NCO (Numerical Controlled Oscillator)).

Figure 3:
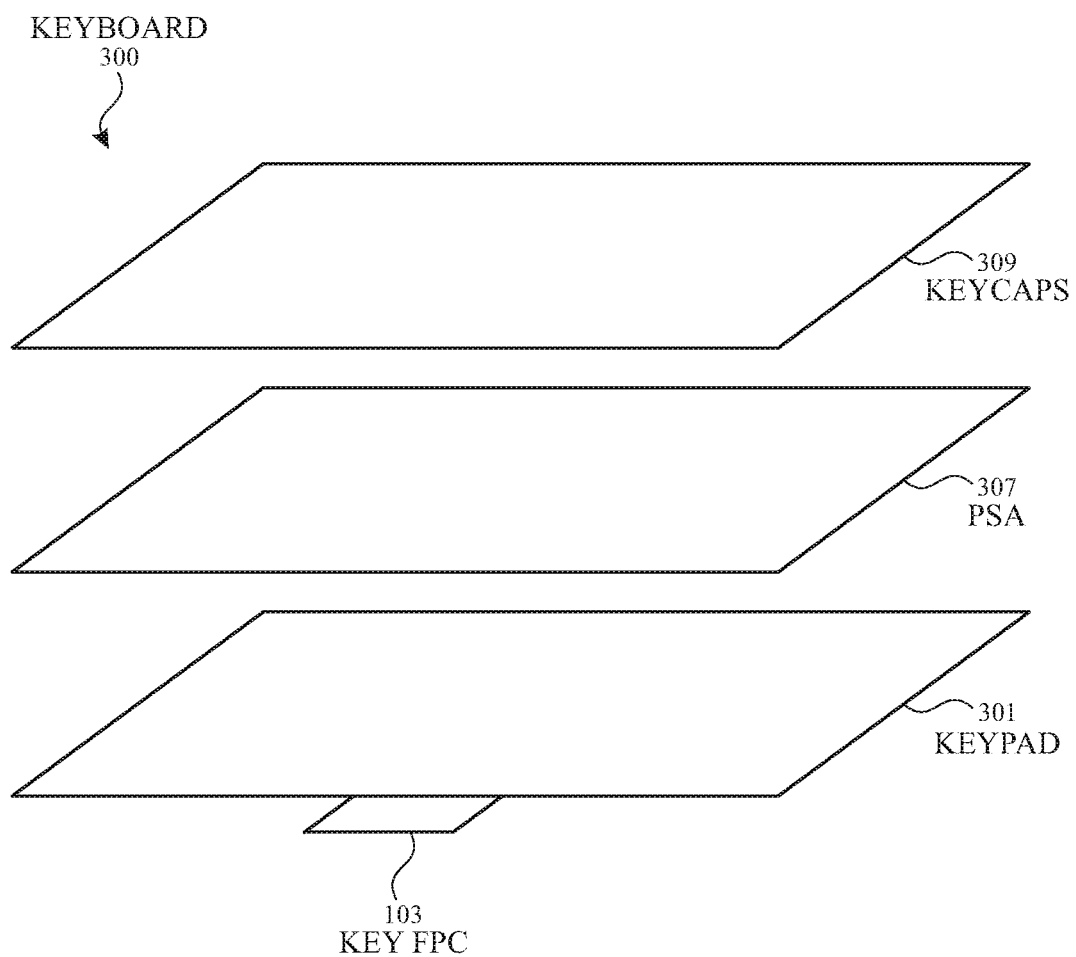
FIG. 3 illustrates an exploded view of a stackup of an exemplary touch-sensitive mechanical keyboard according to examples of the disclosure.

FIG. 3 illustrates an exploded view of a stackup of an exemplary touch-sensitive mechanical keyboard 300. The touch-sensitive mechanical keyboard 300 is an example of a touch-sensitive mechanical keyboard 100 and includes a touch sensor similar to the touch sensor 200 for detecting touch events on the surface of some or all of the mechanical keys (not shown) of the keyboard 300.

The keyboard 300 can include keycaps 309. The keycaps 309 can include multiple discrete portions forming the surface of the mechanical keys. The surface of keycaps 309 can include printed or engraved letters, symbols, or numbers. The keyboard 300 can further include a keypad 301 for detecting a depression of one or more of the keycaps 309. The keypad 301 can include multiple domes. In some examples, the domes may be rubber domes that are configured to couple pairs of conductive electrodes located below the dome for detecting the depression of one or more of the mechanical keys. In some examples, the domes may be metal domes that are configured to couple the metal dome (or an electrode located on the metal dome) to an electrode located below the metal dome for detecting the depression of one or more of the mechanical keys.

The keypad 301 can further include touch sensing electrodes for detecting touch events on the surface of the mechanical keys 101. In some examples, the touch sensor can be configured to sense changes in the total self-capacitance of the touch electrodes. At least some of the electrodes used for touch sensing can also be the electrodes used for detecting the depression of the keycaps 309.

In some examples, the keyboard 300 can include adhesive, such as a pressure sensitive adhesive (307) layer, to attach the keycaps 309 to the keypad 301.

The keyboard 300 can further include a processor (not shown) that emits a scanning signal along the routing traces to the electrodes on the membrane or the PCB to the electrodes. When the signal in one or more electrodes changes due to coupling by the dome, the processor generates a code corresponding to the key associated to that electrode(s). This information can be transmitted through a key FPC 103 to a processor or computing device, such as a laptop computer, desktop computer, mobile device, mobile phone, or the like.

Each mechanical key can have associated therewith any number of touch electrodes depending on the desired touch resolution. For example, a touch electrode can be located underneath each keycap 309 to detect touch events along the surface of the keycaps 309. The keyboard can also include additional touch electrodes that may not be located underneath each keycap 309, but instead may be proximate to (e.g., surrounding) a keycap.

As discussed above, the keyboards 100 and 300 can be capable of receiving both key depression inputs and touch event inputs. As a result, the keyboards 100 and 300 can output two streams of information: a first data stream containing signals representative of a detected depression of one or more mechanical keys and a second data stream containing signals representative of one or more detected touch events. The streams of information can be output via the key FPC 103 to the processor. In some examples, the streams of information can be output along the same signals. When a user contacts a surface of a mechanical key, the key FPC 103 can report a detected touch event. When a key is depressed, the key FPC 103 can report a detected key depression event. As discussed in detail below, a processor can receive signals from the key FPC 103 and can distinguish between the detected touch event and the detected depression based on characteristics of the signals.

Figure 4A:
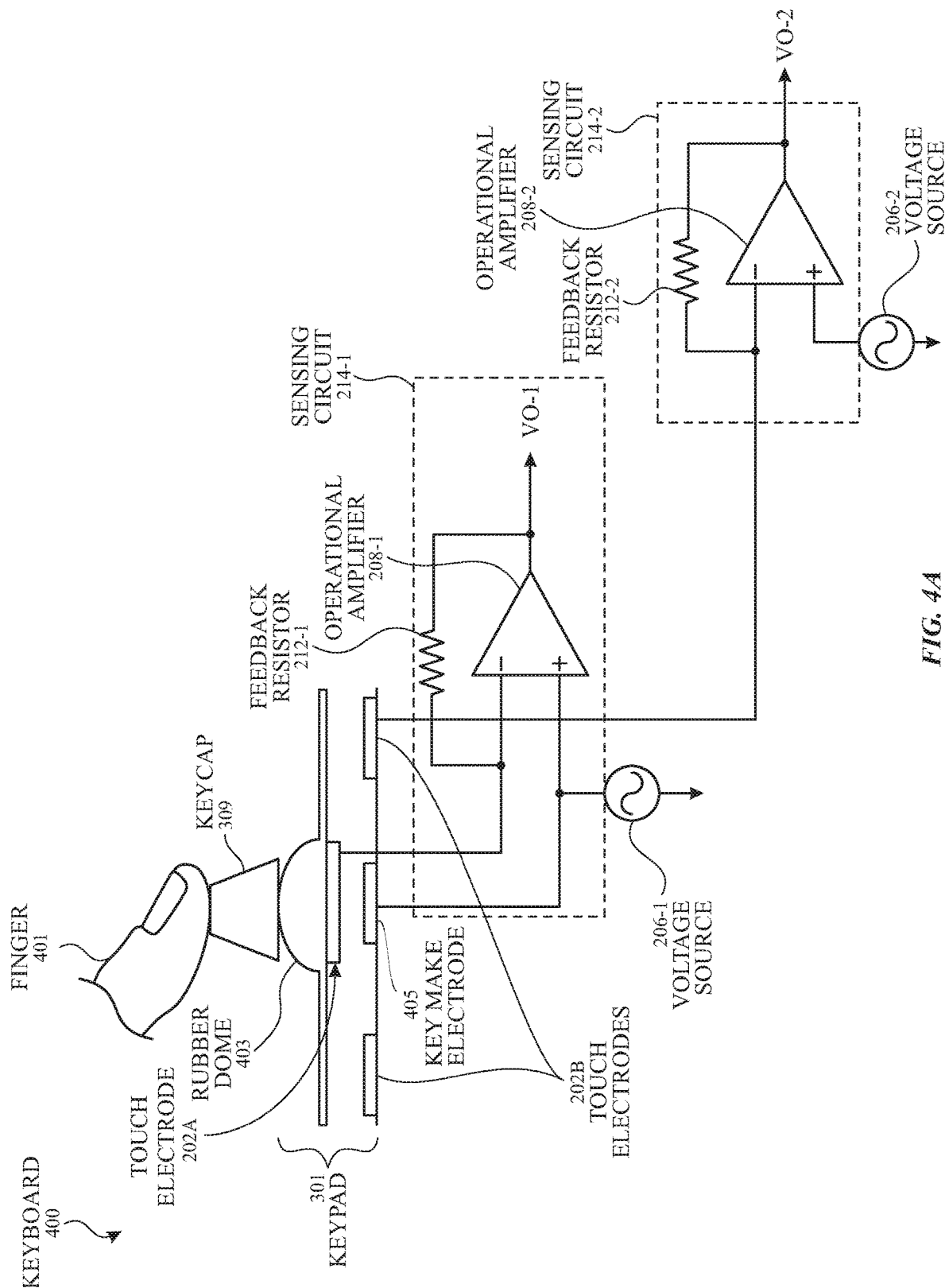
FIG. 4A illustrates a user performing a touch event on a surface of a key of a touch-sensitive mechanical keyboard including rubber domes according to examples of the disclosure.

To illustrate, FIG. 4A shows a user inputting a touch event on a keyboard 400 that includes a rubber dome. The keyboard 400 can include a plurality of keycaps 309 and a keypad 301. The keypad 301 can include a rubber dome 403, a key make electrode 405, touch electrodes 202A, and touch electrodes 202B. The figure illustrates a single keycap 309, a single rubber dome 403, a single key make electrode 405, and a single touch electrode 202A merely for purposes of simplicity, and examples of the disclosure can include multiple keycaps, key make electrodes, and touch electrodes. The keyboard 400 can correspond to the keyboard 100 and/or 300.

The rubber dome 403 can be located between the keycap 309 and the key make electrode 405. The touch electrode 202A can be a touch electrode located underneath a keycap 309. The touch electrode 202A can be located underneath the rubber dome 403 and can be spatially separated from the key make electrode 405 when the keycap 309 is not depressed. The material between the touch electrode 202A and the key make electrode 405 when the keycap 309 is not depressed can be, e.g., air.

The keyboard 400 may also include touch electrodes 202B, which may be touch electrodes not located under a rubber dome 403. In some examples, the touch electrodes 202A and 202B can have the same structural and operational characteristics. The sensing circuits 214-1 and 214-2 may also have the same structural and operational characteristics, but the inputs of the operational amplifiers 208-1 and 208-2 may be coupled in a different manner. The sensing circuits 214-1 and 214-2 each can include a respective voltage source 206, operational amplifier 208, and feedback resistor 212. The touch electrode 202A and the key make electrode 405 can be coupled to the inverting (−) and non-inverting (+) inputs, respectively, of the operational amplifier 208-1. The touch electrode 202B and the voltage source 206-2 may be coupled to the inverting (−) and non-inverting (+) inputs, respectively, of the operational amplifier 208-2. In some examples, the sensing circuits 214-1 and 214-2 can be coupled to the same voltage source 206 (not shown).

The outputs of the sensing circuits Vo-1 and Vo-2 can each be filtered, heterodyned or homodyned, etc., as discussed above, and then transmitted along the key FPC 103 to a processor to determine whether a key depression event occurred and/or whether a proximity or a touch event occurred. In some examples, a multiplexer or a combiner (not shown) can be used to send a single signal per keycap 309 to the processor via the key FPC 103. The multiplexer can select between the outputs Vo-1 and Vo-2, or the combiner can combine them.

The user can apply a finger 401 to the surface of the keycap 309 without exerting sufficient downward force to depress the rubber dome 403. This action can cause the touch sensor via the touch electrodes 202 to detect the touch event and transmit a signal indicative of a detected touch event via the key FPC 103. In some examples, the touch electrode 202A that detects the touch event may be located underneath the rubber dome 403, where the touch event can be detected via hover sensing. In hover sensing, the finger 401 may be near, but not contacting, the touch electrode 202A when the touch event is detected. Although hover sensing concepts may be used to detect the finger 401 contacting the surface of the keycap 309, the keyboard may register the event as a touch event. Additionally, the touch electrodes 202B, which may not be located underneath the rubber dome 403 but may be located proximate to the finger 401, may also detect the touch event. Since the rubber dome 403 is not depressed, the keypad 301 may not transmit a signal indicative of a depression of the keycap 309. Similarly, when a user places a finger 401 at or proximate to the surface of the keycap 309, the keypad 301 may transmit a signal indicative of a detected touch event via the FPC 103. The touch event can be detected by the touch electrode 202A, the touch electrode(s) 202B, or both, and the information indicative of the touch event can be generated by the sensing circuit 214-1, the sensing circuit 214-2, or both.

Figure 4B:
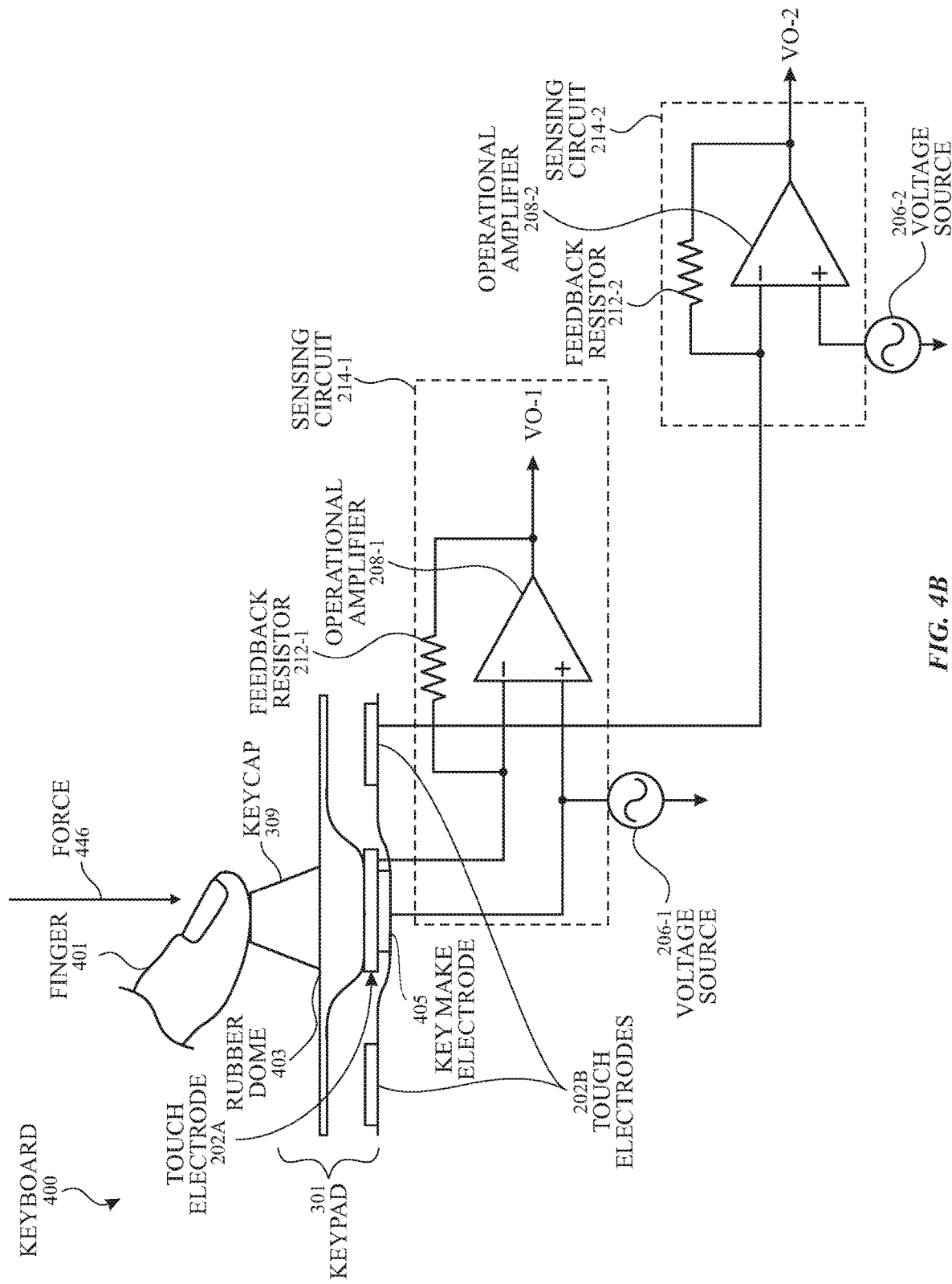
FIG. 4B illustrates a user depressing a key of a touch-sensitive mechanical keyboard including rubber domes according to examples of the disclosure.

FIG. 4B shows a user entering a key stroke by applying a finger 401 to the surface of the keycap 309 and exerting a downward force 446. The force 446 can be sufficient to depress the rubber dome 403. This action can cause the force 446 applied by the finger 401 to transfer to the rubber dome 403 and can compress the rubber dome 403, moving its bottom downward towards the touch electrode 202A. The movement of the bottom of the rubber dome 403 can cause the touch electrode 202A to make electrical contact with the key make electrode 405 located underneath it. The electrical contact between the touch electrode 202A and the key make electrode 405 can create an electrical short between the inverting (−) and non-inverting (+) inputs of the operational amplifier 208-1. The electrical short can cause the signal Vo-1 output from the operational amplifier 208-1 to saturate.

In some examples, the processor may receive a single output signal (not shown) from the sensing circuits 214-1 and 214-2 and may be able to distinguish between a detected touch event and a detected key depression based on the signal. If the output signal is saturated, the processor can determine that the event is a key depression event. If the output signal is not saturated and some event has occurred, the processor can determine that the event is a touch or hover event.

Figure 4C:
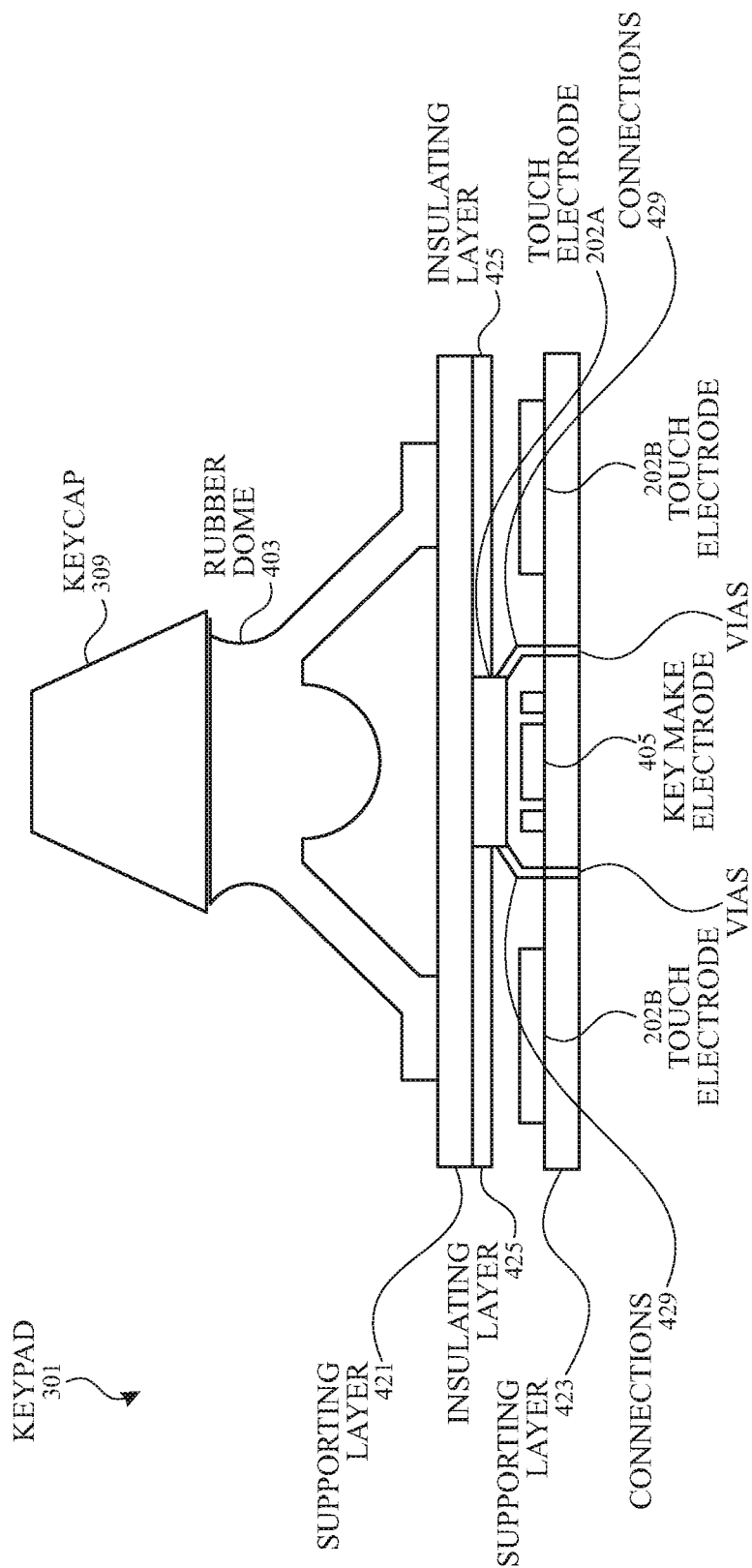
FIGS. 4C-4D illustrate cross-sectional views of exemplary keypads including a rubber dome according to examples of the disclosure.

The keypad 301 may include a membrane for supporting the rubber dome 403. FIG. 4C illustrates a cross-sectional view of an exemplary keypad including a rubber dome according to examples of the disclosure. The keypad 301 can include a rubber dome 403 that may be attached to a supporting layer 421. The supporting layer 421 may be a flexible material, such as polyethylene terephthalate (PET) membrane, to allow the supporting layer 421 to flex in response to an applied force on the rubber dome 403. The touch electrode 202A may be attached to or disposed on the bottom side of the rubber dome 403. Optionally, the keypad 301 can include an insulating layer 425, which can be a passivation layer that protects the touch electrodes 202B when the corresponding keycap is depressed. The insulating layer 425 can be disposed on the supporting layer 421 and can be located on the same layer as the touch electrode 202A.

The key make electrode 405 and the touch electrodes 202B can be disposed on a supporting layer 423. The supporting layer 432 can be a PET membrane, a PCB, or a transparent layer. The supporting layer 423 can include one or more vias 427 to which connections 429 from the touch electrode 202A can be made to a FPC, for example. The connections 429 may, for example, include an anisotropic conductive film (ACF). Spacers 431 may also be disposed or attached to the supporting layer 423 and located between the supporting layer 423 and the touch electrode 202A. In some examples, the spacers 431 can surround the key make electrode 405. The spacers 431 can be used to prevent the touch electrode 202A from damaging the key make electrode 405 during a key depression. In some examples, the spacers 431 can be made of plastic.

The key make electrode 405 may include a material different from the touch electrodes 202A, touch electrodes 202B, or both. For example, the key make electrode 405 can be a silver (Ag) ink, while the touch electrodes 202A, 202B, or both can be copper. In some examples, the touch electrodes 202A, 202B, or both may also be a silver ink.

Figure 4D:
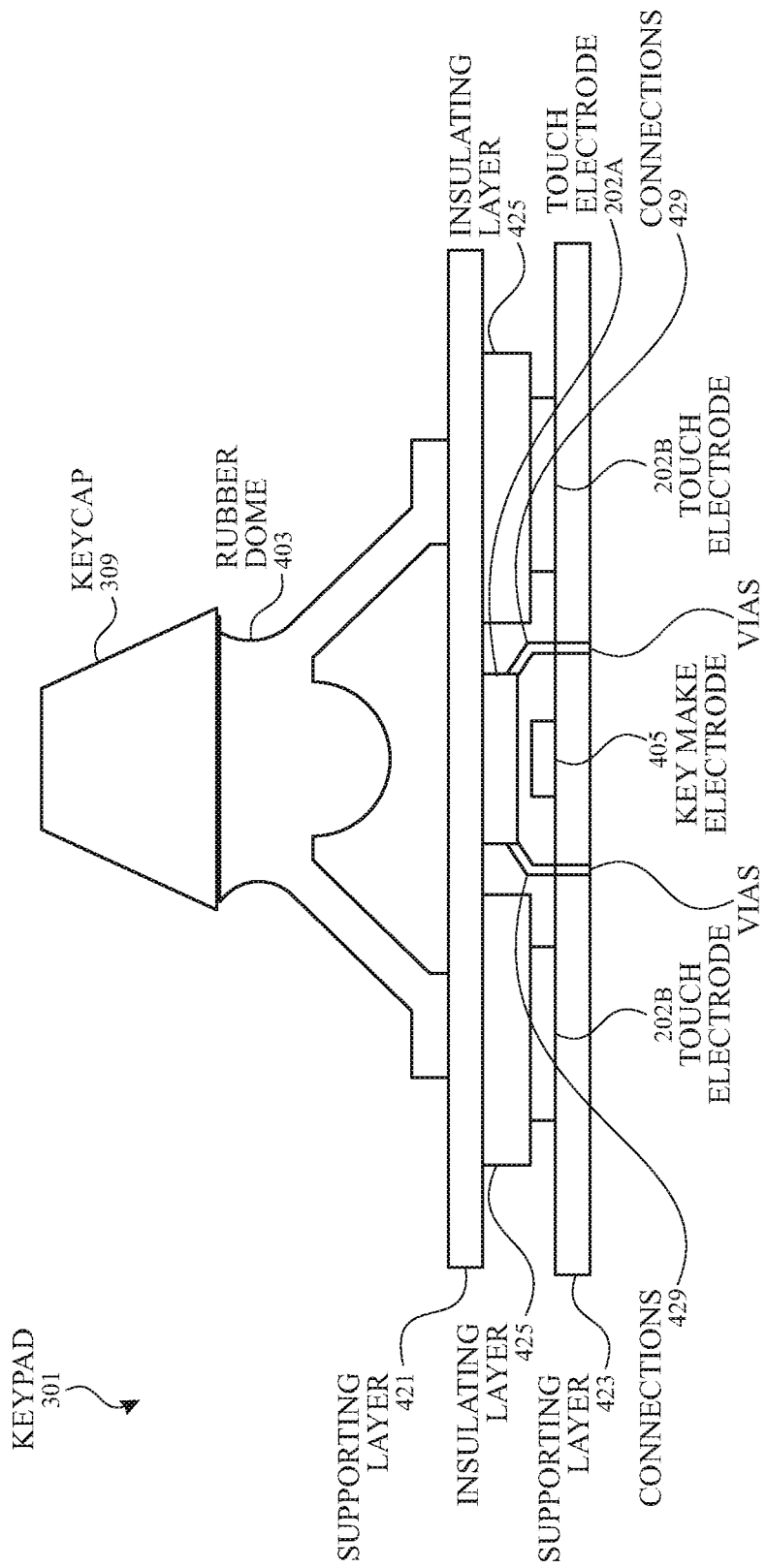

In some examples, the insulating layer 425 can also be spacers, as shown in FIG. 4D. The thickness of the insulating layer 425 may be determined such that the touch electrode 202A and the key make electrode 405 are spatially separated when the keycap is not depressed.

Figure 5:
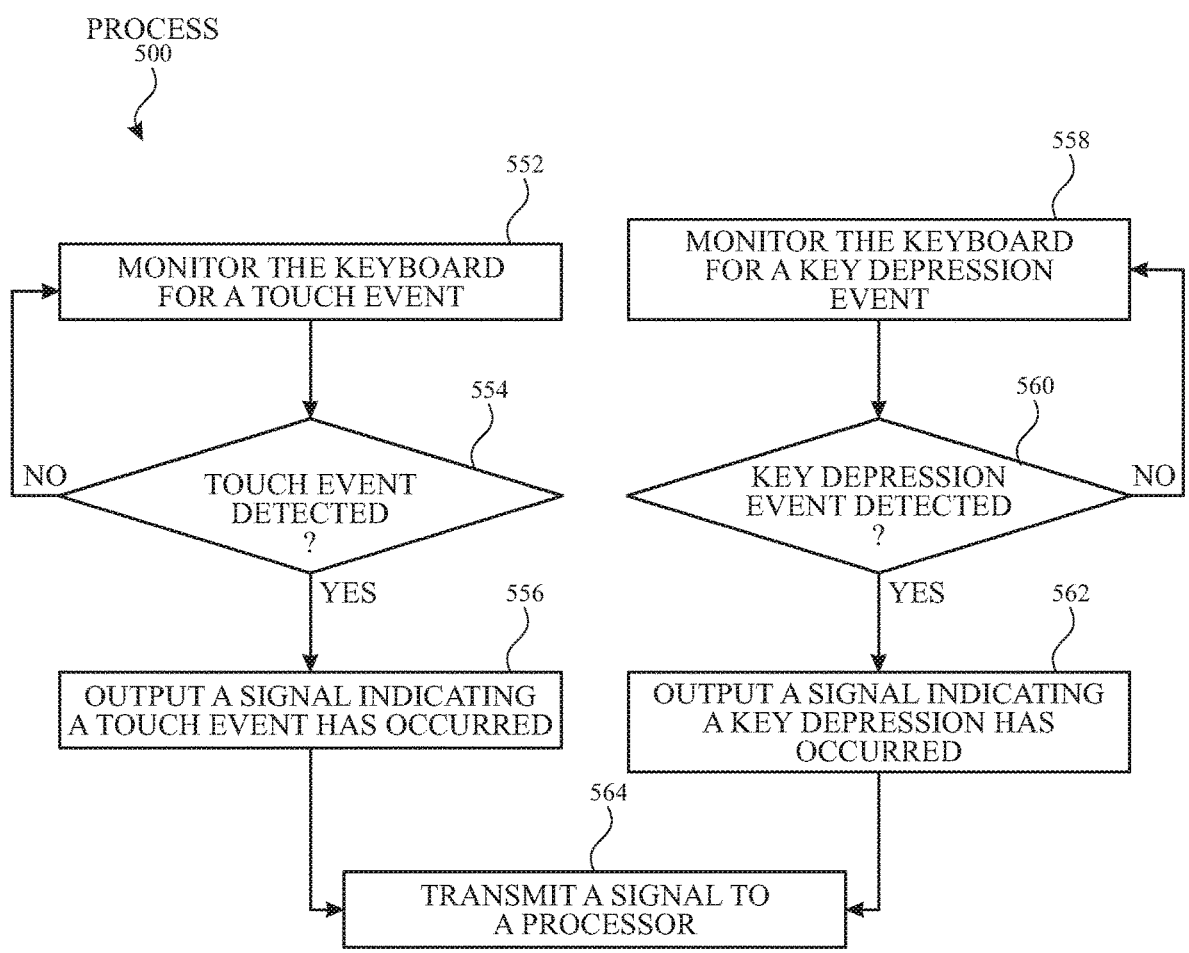
FIG. 5 illustrates an exemplary process for detecting touch events and key depressions on a touch-sensitive mechanical keyboard including rubber domes according to examples of the disclosure.

FIG. 5 shows an exemplary process 500 for detecting touch events and key depressions on a touch-sensitive mechanical keyboard including rubber domes, similar or identical to the touch-sensitive mechanical keyboards 100 or 300.

At step 552 of process 500, the surface of some or all of the mechanical keys of a touch-sensitive mechanical keyboard can be monitored for a touch event. In some examples, a touch sensor similar or identical to touch sensor 200 can be used to detect touch events on or near the surface of mechanical keys 101. If no touch event is detected (at step 554), the process can repeat back to step 552 where the surface of some or all of mechanical keys 101 can continue to be monitored. If a touch event is detected (at bock 554), the process can proceed to step 556. At step 556, the keypad 301 can output a signal indicating that a touch event has occurred as well as information relating to the touch event (e.g., location, duration, motion, or the like).

At step 558 of process 500, the mechanical keys of a touch-sensitive mechanical keyboard can be monitored for a depression of one or more of the mechanical keys. If a key depression event is not detected (at step 560), the process can repeat back to step 552 where the mechanical keys 101 can continue to be monitored. If a key depression is detected (at step 560), the process can proceed to step 562. At step 562, the keypad 301 can output a signal indicating that a key depression has occurred as well as information relating to the key depression (e.g., key depressed, duration, or the like).

At step 564, the outputs from steps 556 and 562 can be multiplexed or combined, and a signal can be transmitted to a processor via the key FPC 103. The processor can be located within the touch-sensitive mechanical keyboard or can be located separate from the touch-sensitive mechanical keyboard.

In some examples, a processor located in a host computer, in the keyboard assembly, or elsewhere, can be used to determine if only a touch event has been detected, or if a key depression have been detected. The processor can be the same processor used to receive the touch event signal and key depression signal described above. Alternatively, the processor can be a different processor than that used to receive the touch event signal and the key depression signal described above. The processor(s) can be coupled to the signals from the sensing circuit within touch-sensitive mechanical keyboard (e.g., keyboard 100 or 300) via a connector (e.g., FPC 103).

In some examples, the processor can use the received signals to determine whether the event(s) correspond to different types of event, such as a tap or slide event, a keyboard wakeup event, etc.

In some examples, the keyboard can include multiple different processors for receiving and analyzing signals from the sensing circuits 214-1 and 214-2. The keyboard may also include multiple connectors (e.g., a plurality of FPCs) and corresponding routing traces for transmitting the output signals from the sensing circuits 214-1 and 214-2. The different processors can execute different steps of process 700. For example, a first processor can be used to detect touch events (e.g., steps 752-756), and a second processor can be used to detect key depression events (e.g., steps 758-762).

Although the figure illustrates steps 552, 554, and 556 occurring at the same time as steps 558, 560, and 552, examples of the disclosure can include certain steps occurring before or after other steps. For example, the keypad 301 may scan for touch events (steps 552, 554, and 556) first before scanning for key depression events (steps 558, 560, and 562). Alternatively, certain steps may be omitted or may be a trigger for other steps. As one example, the keypad 301 may scan for key depression events only when the keyboard is in a sleep mode.

Figure 6A:
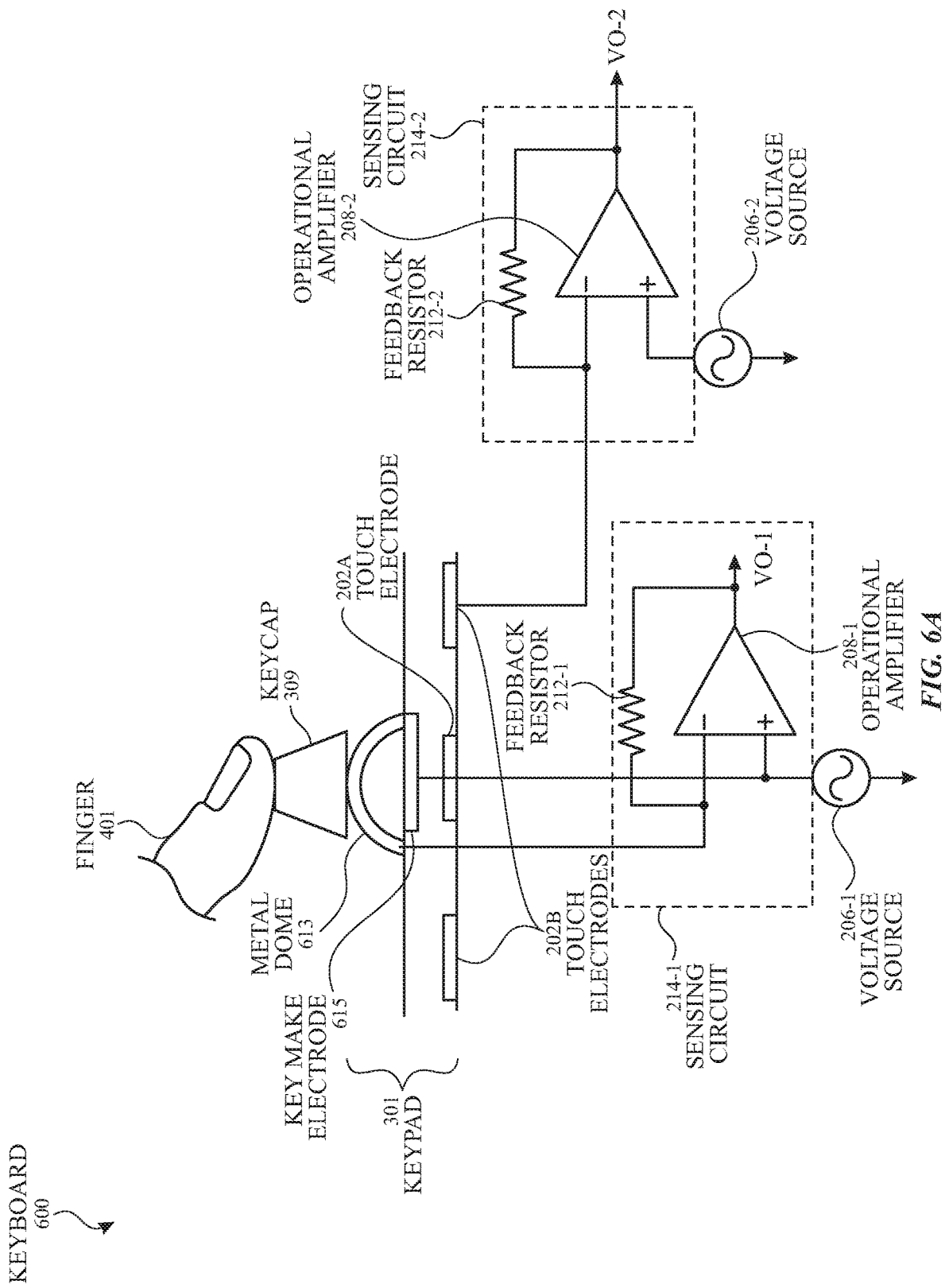
FIG. 6A illustrates a user performing a touch event on a surface of a key of a touch-sensitive mechanical keyboard including metal domes according to examples of the disclosure.

In some examples, the keyboard can include a metal dome. FIG. 6A illustrates a user performing a touch event on a surface of a key of a touch-sensitive mechanical keyboard including metal domes according to various examples. The keyboard 600 can include a keycap 309 and a keypad 301. The keypad 301 can include a metal dome 613, a key make electrode 615, a touch electrode 202A, and touch electrodes 202B. The figure illustrates a single keycap 309, a single key make electrode 405, and a single touch electrode 202A merely for purposes of simplicity, but examples of the disclosure can include multiple keycaps, key make electrodes, and touch electrodes. The keyboard 600 can correspond to the keyboard 100 and/or 300.

The metal dome 613 can be located between the keycap 309 and the touch electrode 202A. The touch electrode 202A can be a touch electrode located underneath a keycap 309. The key make electrode 615 can be located underneath the metal dome 613 and can be spatially separated from the touch electrodes 202A when the keycap 309 is not depressed. The material between the key make electrode 615 and the touch electrode 202A when the keycap 309 is not depressed can be, e.g., air.

The keyboard 600 may also include touch electrodes 202B, which may be touch electrodes not located under a metal dome 613. In some examples, the touch electrodes 202A and 202B can have the same structural and operational characteristics. The sensing circuits 214-1 and 214-2 may also have the same structural and operational characteristics, but the inputs of the operational amplifiers 208-1 and 208-2 may be coupled in a different manner. The sensing circuits 214-1 and 214-2 each can include a respective voltage source 206, operational amplifier 208, and feedback resistor 212. In some examples, the sensing circuits 214-1 and 214-2 can be coupled to the same voltage source 206 (not shown).

The metal dome 613 and the key make electrode 615 can be coupled to the inverting (−) and non-inverting (+) inputs, respectively, of the operational amplifier 208-1. The touch electrode 202B and a voltage source 206-2 may be coupled to the inverting (−) and non-inverting (+) inputs, respectively, of the operational amplifier 208-2. The touch electrodes 202A may not be coupled to a sensing circuit when the keycap 309 is not depressed, but may be coupled to the sensing circuit 214-1 via the key make electrode 615 when the keycap 309 is depressed (discussed below).

The outputs of the sensing circuits Vo-1 and Vo-2 can each be filtered, heterodyned or homodyned, etc., as discussed above, and then transmitted along the key FPC 103 to a processor to determine whether a key depression event occurred and/or whether a proximity or a touch event occurred. In some examples, a multiplexer or a combiner (not shown) can be used to send a single signal per keycap 309 to the processor via the key FPC 103. The multiplexer can select between the outputs Vo-1 and Vo-2, or the combiner can combine them.

The user can apply a finger 401 to the surface of the keycap 309 without exerting sufficient downward force to depress the metal dome 613. This action can cause the touch sensor via the touch electrodes 202 to detect the touch event and transmit a signal indicative of a touch event via the key FPC 103. In some examples, the touch electrode 202A can detect the touch event and may be located underneath the metal dome 613, where the touch event can be detected via hover sensing. In hover sensing, the finger 401 may be near, but not contacting, the touch electrode 202A when the touch event is detected. Although hover sensing concepts may be used to detect the finger 401 contacting the surface of the keycap 309, the keyboard may register the event as a touch event. Additionally, the touch electrodes 202B, which may not be located underneath the metal dome 613 but may be located proximate to the finger 401, may also detect the touch event. Since the metal dome 613 is not depressed, the keypad 301 may not transmit a signal indicative of a depression of the keycap 309. When a user places the finger 401 at or proximate to the surface of the keycap 309, the keypad 301 may transmit a signal indicative of a detected touch event via the FPC 103. In this manner, the touch event can be detected by the touch electrode 202A, the touch electrode(s) 202B, or both, and the information indicative of the touch event can be generated by the sensing circuit 214-1, the sensing circuit 214-2, or both.

In some examples, the processor may receive signals from both Vo-1 and Vo-2 and may apply different adjustment factors given that Vo-1 may be associated with deflections caused by the shape of the metal dome 613, and Vo-2 may not. The adjustment factors may differ for different metal domes 613. In some examples, a component separate from the processor may apply the adjustment factors.

In some instances, the keyboard may be calibrated such that its processor may analyze the signals and determine that no key depression event occurred based on signal characteristics corresponding to a range of deflections. In some instances, the signal characteristics corresponding to the range of deflections can be predetermined to reduce or prevent false detection of key depression events. For example, a user may swipe his or her hand across the finger with an amount of force that may cause the keycaps to depress slightly and not fully. The processor can analyze the signals and determine, using the adjustment factors, that the user's movement was not one involving key depression events. In some examples, the processor can receive signals from touch electrodes 202B adjacent to a keycap 309 and can use the signals to determine the adjustment factor for the corresponding metal dome 613.

Figure 6B:
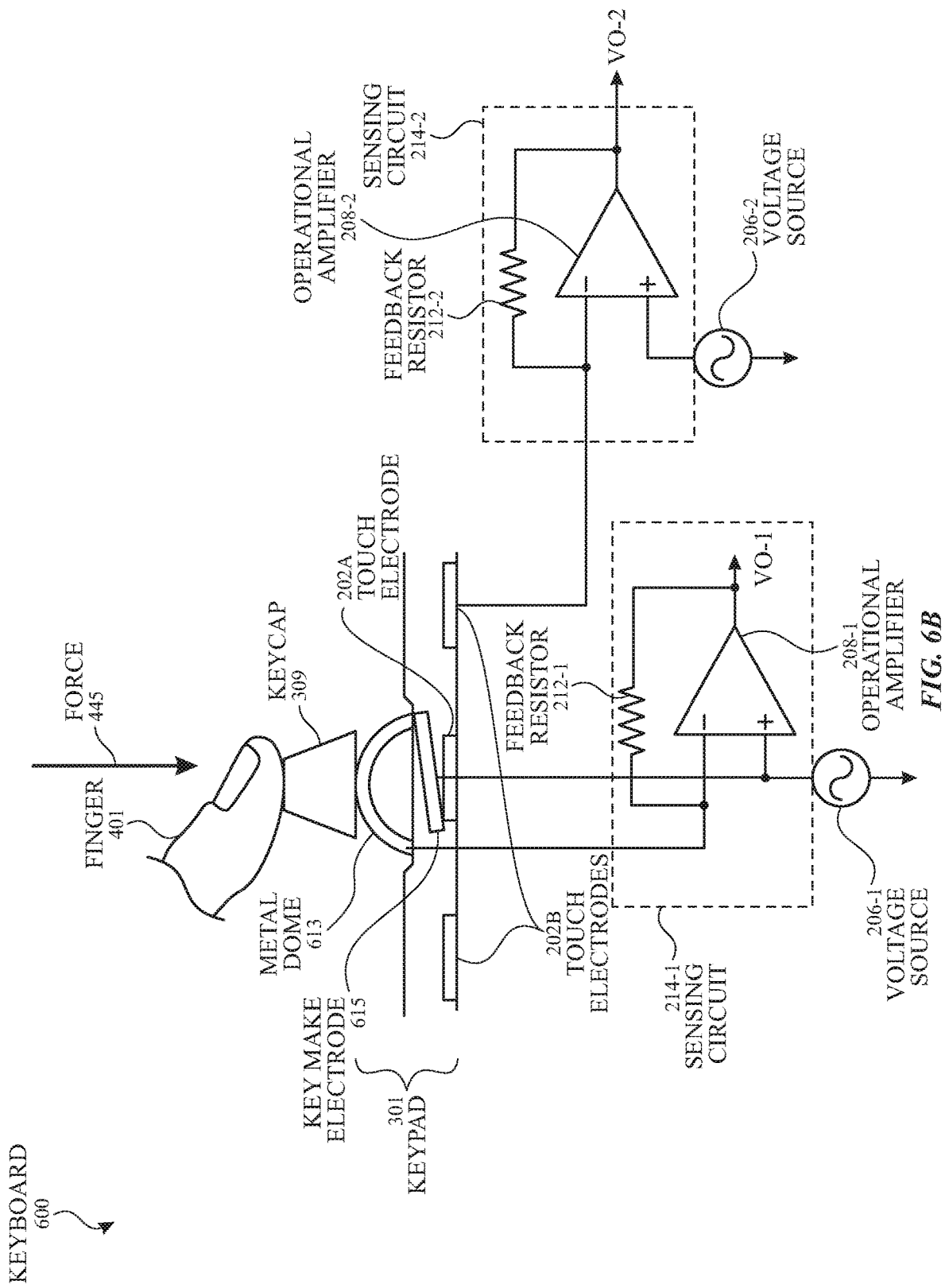
FIG. 6B illustrates a user initially depressing a key of a touch-sensitive mechanical keyboard including metal domes according to examples of the disclosure.

FIG. 6B shows a user entering a key stroke by applying the finger 401 to the surface of the keycap 309 and exerting an intermediate amount of downward force 445 to begin depression of the metal dome 613. An intermediate amount of downward force refers to an amount of force sufficient for the key make electrode 615 to make partial contact with the touch electrode 202A located underneath it. This action can cause the force applied by the finger 401 to transfer to the metal dome 613. The intermediate amount of downward force 445 can cause the key make electrode 615 to lower down toward the touch electrode 202A. The key make electrode 615 can make electrical contact with the touch electrode 202A, as shown in the figure. The partial electrical contact between the key make electrode 615 and the touch electrode 202A can create an electrical contact that changes the contact resistance. The operational amplifier 208-1 can produce a signal indicative of the contact resistance, and this signal can be the output of the sensing circuit 214-1 Vo-1.

Figure 6C:
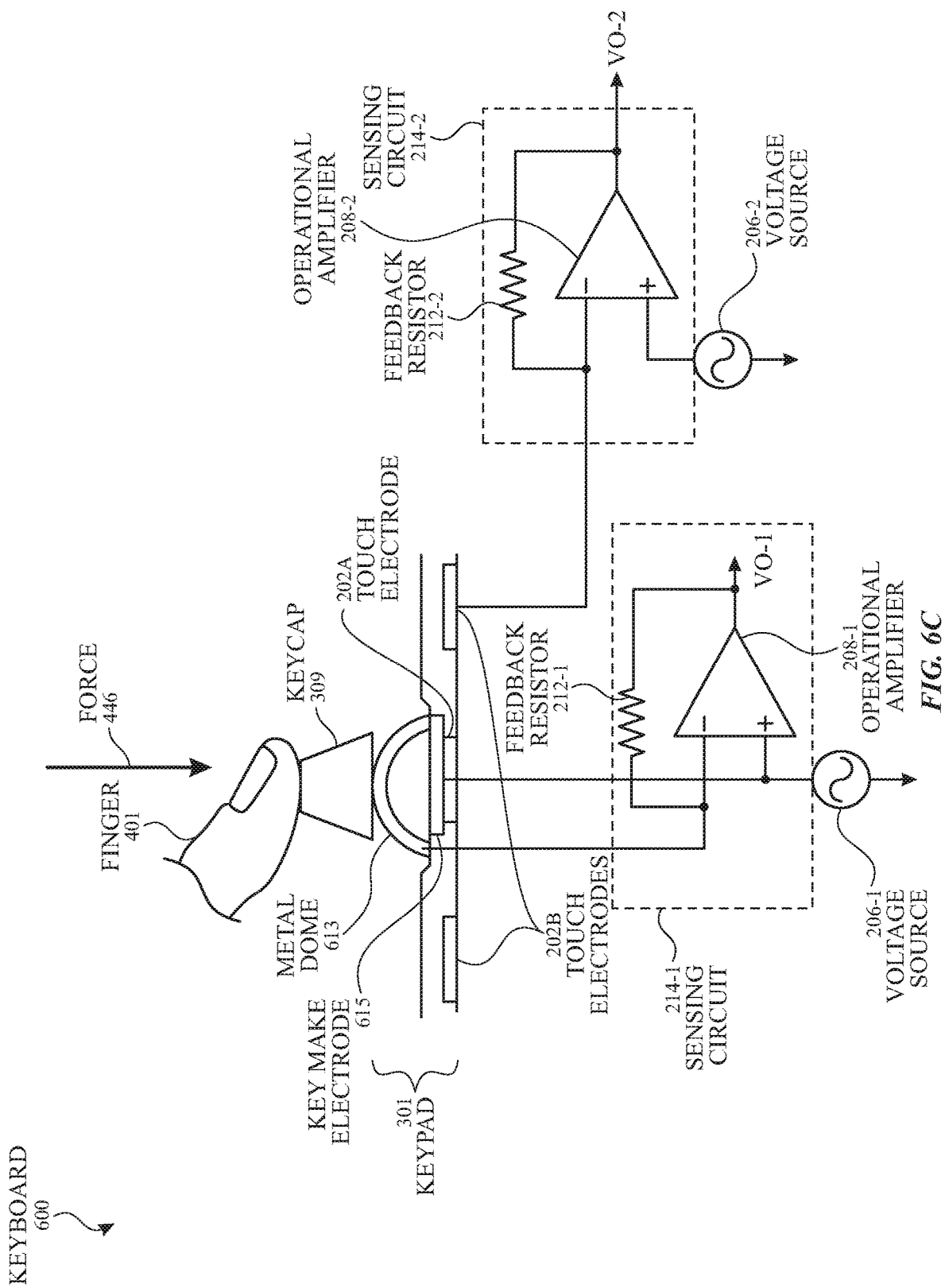
FIG. 6C illustrates a user fully depressing a key of a touch-sensitive mechanical keyboard including metal domes according to examples of the disclosure.

FIG. 6C shows a user entering a key stroke by applying the finger to the surface of the keycap 309 and exerting a full amount of downward force 446 sufficient to depress the metal dome 613. A full amount of downward force refers to an amount of force sufficient for the key make electrode 615 to make full contact with the touch electrode 202A. This action can cause the force 446 applied by the finger 401 to transfer to the metal dome 613, moving it downward towards the touch electrode 202A. The full amount of downward force 446 can cause the already-lowered key make electrode 615 to make full contact with the touch electrode 202A, as shown in the figure. The full electrical contact between the key make electrode 615 and the touch electrode 202A can change the contact resistance relative to an intermediate amount of downward force 445 (as shown in FIG. 6B). In some instances, the contact resistance associated with the partial electrical contact can be greater than the contact resistance associated with the full electrical contact. The operational amplifier 208-1 can produce a signal indicative of the contact resistance, and this signal can be the output of the sensing circuit 214-1 Vo-1.

When the metal dome 613 is depressed, the keypad 301 may also transmit a signal along the output VO-2 of the sensing circuit 214-2 indicative of a touch event if the touch electrode 202B, coupled to the sensing circuit 214-2, senses the finger 401's presence. The keypad 301 may also transmit a signal along the output VO-1 of the sensing circuit 214-2 indicative of a key depression event. In some examples, the processor may receive a single output signal from the sensing circuit 214-1 and may be able to distinguish between an initial depression of the keycap 309 and a full depression of the keycap 309 based on the signal. If the output signal has a first voltage, corresponding to the contact resistance of a partial contact between the metal dome 613 and the touch electrode 202A, the processor can determine that the event is an initial key depression event. If the output signal has a second voltage, corresponding to the contact resistance of a full contact between the metal dome 613 and the touch electrode 202A, the processor can determine that the event is a full key depression event. In some examples, the second voltage can be greater than the first voltage. In some examples, the second voltage can correspond to the output signal being saturated.

In some instances, the processor can determine that the event is a full key depression event based on the timing of the initial key depression event occurring first. Configuring the keyboard 600 with the capability of detecting an initial key depression may reduce any delays that may occur between the downward force applied by the finger 401 and the keyboard 600 registering a key depression event.

Figure 7:
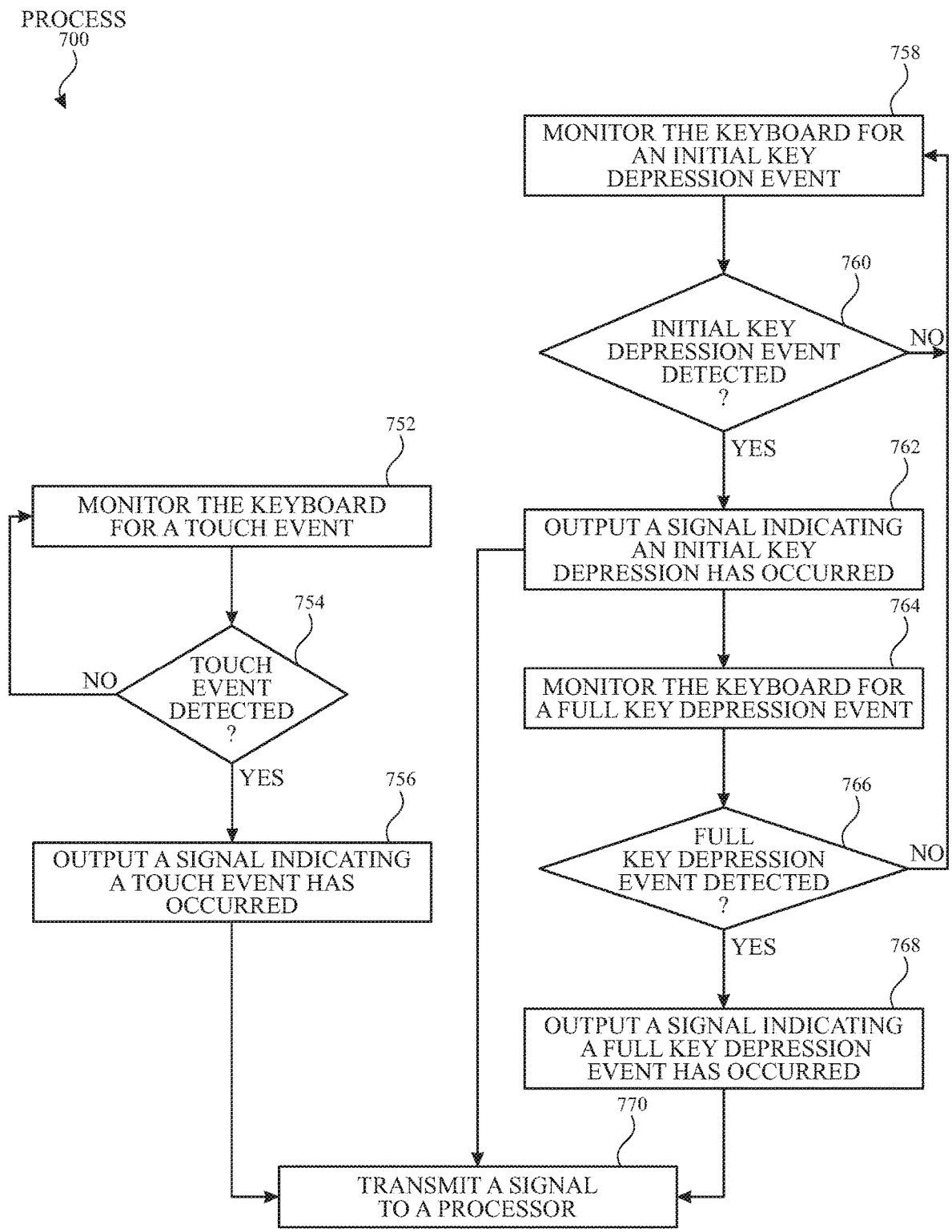
FIG. 7 illustrates an exemplary process for detecting touch events and key depressions on a touch-sensitive mechanical keyboard including rubber domes according to examples of the disclosure.

FIG. 7 shows an exemplary process 700 for detecting touch events and key depressions on a touch-sensitive mechanical including metal domes, similar or identical to touch-sensitive mechanical keyboards 100 or 300.

At step 752 of process 700, the surface of some or all of the mechanical keys of a touch-sensitive mechanical keyboard can be monitored for a touch event. In some examples, a touch sensor similar or identical to touch sensor 200 can be used to detect touch events on or near the surface of mechanical keys 101. If a touch event is not detected (at step 754), the process can repeat back to step 752 where the surface of some or all of mechanical keys 101 can continue to be monitored. If a touch event is detected (at bock 754), the process can proceed to step 756. At step 756, the keypad 301 can output a signal indicating that a touch event has occurred as well as information relating to the touch event (e.g., location, duration, motion, or the like).

At steps 758 and 764 of process 700, the mechanical keys of a touch-sensitive mechanical keyboard can be monitored for a depression of an initial key depression, a full key depression, or both. If an initial key depression event is not detected (at step 760), the process can repeat back to step 758 where keyboard can continue to be monitored for a key depression event. If an initial key depression event is detected (at step 760), the process can proceed to step 762. At step 762, the keypad of the touch-sensitive mechanical keyboard, such as keyboard 100 or 300, can output a signal indicating that an initial key depression has occurred as well as information relating to the key depression (e.g., key depressed or the like).

Optionally, the mechanical keys can be monitored for a full key depression event at step 764. If a full key depression is not detected (at step 766), the process can repeat back to step 752 where the keyboard can continue to be monitored for a touch event. If a full key depression is detected (at step 766), the process can proceed to step 768. At step 768, the keypad of the touch-sensitive mechanical keyboard, such as keyboard 100 or 300, can output a signal indicating that a full key depression has occurred as well as information relating to the key depression (e.g., duration of the key depression or the like). The signal can be the same signal as the key depression signal transmitted during step 762.

At step 570, the outputs from steps 756, 762, or a combination thereof can be multiplexed or combined, and a signal can be transmitted to a processor via the key FPC 103. The processor can be located within the touch-sensitive mechanical keyboard or can be located separate from the touch-sensitive mechanical keyboard.

In some examples, a processor located in a host computer, in the keyboard assembly, or elsewhere, can be used to determine if only a touch event has been detected. The processor can also be used to determine if a key depression have been detected, and if so, what type of key depression (e.g., initial key depression event or full key depression event). The processor can be the same processor used to receive the touch event signal and key depression signal described above. Alternatively, the processor can be a different processor than that used to receive the touch event signal and key depression signal described above. For example, in some examples, the processor can be coupled to the signals from the sensing circuit within a touch-sensitive mechanical keyboard (e.g., keyboard 100 or 300) via a connector (e.g., FPC 103).

In some examples, the processor can use the received signals to determine whether the event(s) correspond to different types of event, such as a tap or slide event, a keyboard wakeup event, etc.

Alternatively, the keyboard can include multiple different processors for receiving and analyzing signals from the sensing circuits 214-1 and 214-2. The keyboard may also include multiple connectors (e.g., a plurality of FPCs) and corresponding routing traces for transmitting the output signals from the sensing circuits 214-1 and 214-2. The different processors can execute different steps of process 700. For example, a first processor can be used to detect touch events (e.g., steps 752, 754, and 756), and a second processor can be used to detect key depression events (e.g., steps 758, 760, 762, 764, 766, and 768).

Although the figure illustrates steps 752, 754, and 756 as occurring at the same time as steps 758, 760, 762, 764, 766, and 768, examples of the disclosure can include certain steps occurring before or after other steps. For example, the keypad 301 may scan for touch events (steps 752, 754, and 756) first before scanning for key depression events (steps 758, 760, 762, 764, 766, and 768). Alternatively, certain steps may be omitted or may be a trigger for other steps. As one example, the keypad 301 may scan for key depression events only when the keyboard is in a sleep mode.

Figure 8:
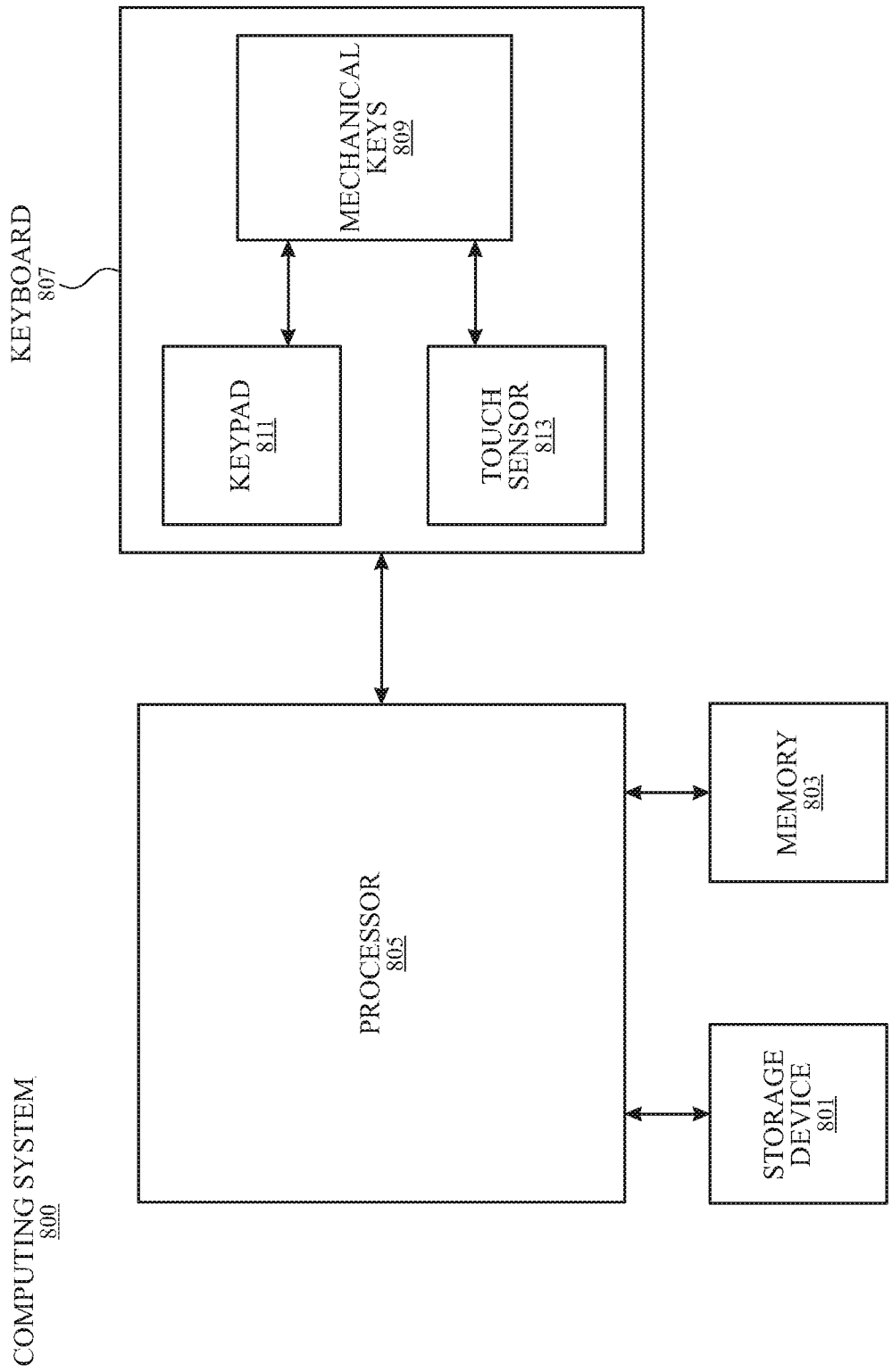
FIG. 8 illustrates an exemplary system including a touch-sensitive mechanical keyboard according to examples of the disclosure.

One or more of the functions relating to the detection of a touch event or key depression can be performed by a computing system similar or identical to computing system 800 shown in FIG. 8. The computing system 800 can include instructions stored in a non-transitory computer readable storage medium, such as a memory 803 or a storage device 801, and executed by a processor 805. The instructions can also be stored and/or transported within any non-transitory computer readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer readable storage medium" can be any medium that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The instructions can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Computing system 800 can further include touch-sensitive mechanical keyboard 807 coupled to processor 805. Touch sensitive mechanical keyboard 807 can be similar or identical to touch-sensitive mechanical keyboard 100 or 300 described above. In some examples, keyboard 807 can include mechanical keys 809, keypad 811, and touch sensor 813 for detecting touch events and key depressions and for providing signals indicating a detection of a touch event or key depression to processor 805. In some examples, mechanical keys 809 can be similar or identical to mechanical keys 101, keypad 811 can be similar or identical to keypad 301, and touch sensor 813 can be similar or identical to touch sensor 200 or touch sensor FPC layer 305, described above. Processor 805 can receive the detection signals from keyboard 807 and interpret them as touch events or key depressions in a manner similar or identical to that described above with respect to process 500.

It is to be understood that the computing system is not limited to the components and configuration of FIG. 8, but can include other or additional components in multiple configurations according to various examples. Additionally, the components of computing system 800 can be included within a single device, or can be distributed between two or more devices. For example, while processor 805 is shown separate from keyboard 807, in some examples, processor 805 can be located within keyboard 807.

Figures 9, 10:
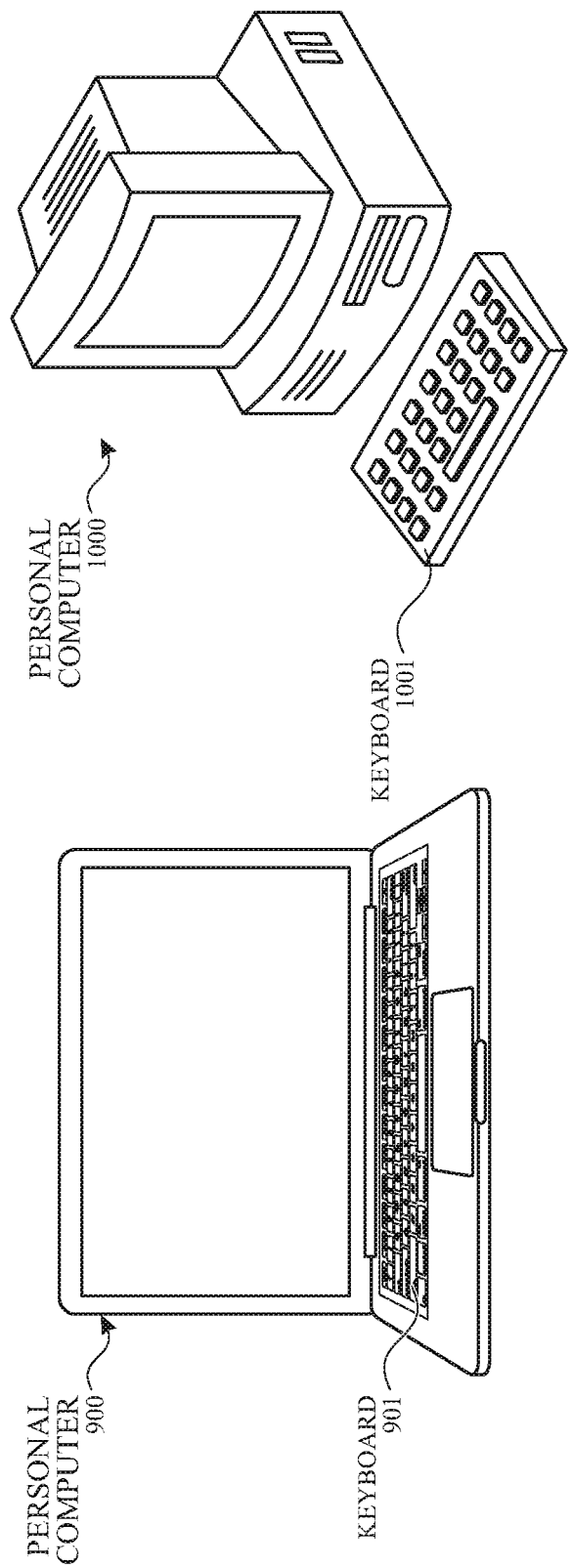
FIG. 9 illustrates an exemplary laptop including a touch-sensitive mechanical keyboard according to examples of the disclosure.
FIG. 10 illustrates an exemplary personal computer including a touch-sensitive mechanical keyboard according to examples of the disclosure.

FIG. 9 illustrates an exemplary personal computer 800 that can include a touch-sensitive mechanical keyboard 901 according to various examples.

FIG. 10 illustrates another exemplary personal computer 900 that can include a touch-sensitive mechanical keyboard 1001 according to various examples.

The personal computers of FIGS. 9 and 10, as well as other computing devices, can receive both touch input and mechanical key input by utilizing a touch-sensitive mechanical keyboard according to various examples.

A keyboard is disclosed. They keyboard can comprise: a plurality of depressible keys operable to, at least in part, detect a key depression event, the plurality of depressible keys including a plurality of domes and a plurality of key make electrodes located under the plurality of domes; a plurality of touch electrodes operable to detect a touch event, the plurality of touch electrodes including first touch electrodes and second touch electrodes; a plurality of sensing circuits, the plurality of sensing circuits including first sensing circuits and second sensing circuits, wherein the first sensing circuits are coupled to the plurality of key make electrodes, wherein the second sensing circuits are coupled to the second touch electrodes, wherein the plurality of sensing circuits generates a plurality of signals in response to the detection of the touch event, in response to the detection of the key depression event, or both; a processor that receives the plurality of signals and determines, based on the plurality of signals, whether an event corresponds to the touch event or the key depression event. Additionally or alternatively, in some examples, the plurality of domes is rubber domes, and the plurality of sensing circuits includes a plurality of operational amplifiers. Additionally or alternatively, in some examples, non-inverting inputs of the plurality of operational amplifiers of the first sensing circuits are coupled to the plurality of key make electrodes, and inverting inputs of the plurality of operational amplifiers of the first sensing circuits are coupled to the first touch electrodes. Additionally or alternatively, in some examples, the keyboard further comprises: a first supporting layer supporting the rubber domes, wherein the first supporting layer is a polyethylene terephthalate (PET) membrane. Additionally or alternatively, in some examples, the keyboard further comprises: an insulating layer located between the second touch electrodes and the first supporting layer. Additionally or alternatively, in some examples, the keyboard further comprises: a second supporting layer supporting the plurality of touch electrodes; and a plurality of spacers located between the plurality of key make electrodes and the second supporting layer. Additionally or alternatively, in some examples, inverting inputs of the plurality of operational amplifiers of the second sensing circuits are coupled to the second touch electrodes, and non-inverting inputs of the plurality of operational amplifiers of the second sensing circuits are coupled to voltage sources. Additionally or alternatively, in some examples, the plurality of domes is metal domes, and the plurality of sensing circuits includes a plurality of operational amplifiers. Additionally or alternatively, in some examples, inverting inputs of the plurality of operational amplifiers of the first sensing circuits are coupled to the metal domes, and non-inverting inputs of the plurality of operational amplifiers of the first sensing circuits are coupled to the plurality of key make electrodes. Additionally or alternatively, in some examples, the metal domes are coupled to the non-inverting inputs and the plurality of key make electrodes during the key depression event. Additionally or alternatively, in some examples, the plurality of key make electrodes and the first touch electrodes are located under the plurality of domes, and the second touch electrodes are not located under the plurality of domes. Additionally or alternatively, in some examples, the first sensing circuits output first signals and the second sensing circuits output second signals, the method further comprising: a multiplexer or a combiner the first signals and the second signals to form the plurality of signals.

A method for an event on a keyboard is disclosed. The method can comprise: monitoring a plurality of depressible keys for a touch event on a surface of one or more of the plurality of depressible keys using a plurality of sensing circuits; monitoring the plurality of depressible keys for a key depression event on the plurality of depressible keys using the plurality of sensing circuits; generating a signal, wherein the signal is indicative of the touch event and indicative of the key depression event; transmitting the signal to a processor; and using the signal to determine whether the event corresponds to the touch event or the key depression event. Additionally or alternatively, in some examples, the method further comprises: determining whether the signal is saturated; and in accordance with the determination that the signal is saturated, determining that the event corresponds to the key depression event. Additionally or alternatively, in some examples, the method further comprises: determining whether the signal is saturated; and in accordance with the determination that the signal is not saturated, determining that the event corresponds to the touch event. Additionally or alternatively, in some examples, the method further comprises: determining whether the signal corresponds to a first contact resistance; and in accordance with the determination that the signal corresponds to the first contact resistance, determining that the event corresponds to the key depression event, where the key depression event is an initial key depression event. Additionally or alternatively, in some examples, the method further comprises: determining whether the signal corresponds to a second contact resistance; and in accordance with the determination that the signal corresponds to the second contact resistance, determining that the event corresponds to the key depression event, where the key depression event is a full key depression event, wherein the first contact resistance is greater than the second contact resistance. Additionally or alternatively, in some examples, the plurality of depressible keys includes a plurality of key make electrodes, and first touch electrodes, wherein the monitoring of the plurality of depressible keys for the touch event includes detecting a hover event using the first touch electrodes located above the plurality of key make electrodes. Additionally or alternatively, in some examples, the plurality of depressible keys includes a plurality of key make electrodes, and the keyboard includes second touch electrodes, the second touch electrodes not located underneath a plurality of domes, wherein the monitoring of the plurality of depressible keys for the touch event includes detecting a hover event using the plurality of second touch electrodes. Additionally or alternatively, in some examples, the plurality of depressible keys includes a plurality of key make electrodes and first touch electrodes, the method further comprising: in response to a depression of at least one of the plurality of depressible keys, contacting a corresponding key make electrode to a corresponding touch electrode. Additionally or alternatively, in some examples, the plurality of depressible keys includes a plurality of key make electrodes and first touch electrodes, the method further comprising: applying an intermediate amount of force to cause an initial depression of at least one of the plurality of depressible keys; and in response to the initial depression of the at least one of the plurality of depressible keys, contacting a portion of a corresponding key make electrode to a corresponding touch electrode. Additionally or alternatively, in some examples, the plurality of depressible keys includes a plurality of key make electrodes and first touch electrodes, the method further comprising: applying a full amount of force to cause a full depression of the at least one of the plurality of depressible keys; and in response to the full depression of the at least one of the plurality of depressible keys, contacting an entirety of a corresponding key make electrode to a corresponding touch electrode.

Although examples have been fully described with reference to the accompanying drawings, it is to be noted that various changes and modifications will become apparent to those skilled in the art. Such changes and modifications are to be understood as being included within the scope of the various examples as defined by the appended claims.

The invention claimed is:

1. A keyboard comprising:
a plurality of depressible keys operable to, at least in part, detect a key depression event, the plurality of depressible keys including a plurality of domes and a plurality of key make electrodes located under the plurality of domes;
a plurality of touch electrodes operable to detect a touch event, the plurality of touch electrodes including first touch electrodes and second touch electrodes;
a plurality of sensing circuits, the plurality of sensing circuits including first sensing circuits and second sensing circuits, wherein the first sensing circuits are coupled to the plurality of key make electrodes, wherein the second sensing circuits are coupled to the second touch electrodes,
wherein the plurality of sensing circuits generate a plurality of signals in response to the detection of the touch event, in response to the detection of the key depression event, or both;
a processor that receives the plurality of signals and determines, based on the plurality of signals, whether an event corresponds to the touch event or the key depression event.

2. The keyboard of claim 1, wherein the plurality of domes is rubber domes, and the plurality of sensing circuits includes a plurality of operational amplifiers.

3. The keyboard of claim 2, wherein non-inverting inputs of the plurality of operational amplifiers of the first sensing circuits are coupled to the plurality of key make electrodes, and inverting inputs of the plurality of operational amplifiers of the first sensing circuits are coupled to the first touch electrodes.

4. The keyboard of claim 2, further comprising:
a first supporting layer supporting the rubber domes, wherein the first supporting layer is a polyethylene terephthalate (PET) membrane.

5. The keyboard of claim 4, further comprising:
an insulating layer located between the second touch electrodes and the first supporting layer.

6. The keyboard of claim 2, further comprising:
a second supporting layer supporting the plurality of touch electrodes; and
a plurality of spacers located between the plurality of key make electrodes and the second supporting layer.

7. The keyboard of claim 1, wherein the plurality of sensing circuits include a plurality of operational amplifiers, and wherein inverting inputs of the plurality of operational amplifiers of the second sensing circuits are coupled to the second touch electrodes, and non-inverting inputs of the plurality of operational amplifiers of the second sensing circuits are coupled to voltage sources.

8. The keyboard of claim 1, wherein the plurality of domes is metal domes, and the plurality of sensing circuits includes a plurality of operational amplifiers.

9. The keyboard of claim 8, wherein inverting inputs of the plurality of operational amplifiers of the first sensing circuits are coupled to the metal domes, and non-inverting inputs of the plurality of operational amplifiers of the first sensing circuits are coupled to the plurality of key make electrodes.

10. The keyboard of claim 9, wherein the metal domes are coupled to the non-inverting inputs and the plurality of key make electrodes during the key depression event.

11. The keyboard of claim 1, wherein the plurality of key make electrodes and the first touch electrodes are located under the plurality of domes, and the second touch electrodes are not located under the plurality of domes.

12. The keyboard of claim 1, wherein the first sensing circuits output first signals and the second sensing circuits output second signals, the method further comprising:
a multiplexer or a combiner the first signals and the second signals to form the plurality of signals.

13. A method for an event on a keyboard, the method comprising:
monitoring a plurality of depressible keys for a touch event on a surface of one or more of the plurality of depressible keys using a plurality of sensing circuits;
monitoring the plurality of depressible keys for a key depression event on the plurality of depressible keys using the plurality of sensing circuits, the key depression event indicative of an amount of contact resistance between two electrodes in direct contact with each other;
generating a signal, wherein the signal is indicative of the touch event and indicative of the key depression event;
transmitting the signal to a processor; and
using the signal to determine whether the event corresponds to the touch event or the key depression event.

14. The method of claim 13, further comprising:
determining whether the signal is saturated; and
in accordance with the determination that the signal is saturated, determining that the event corresponds to the key depression event.

15. The method of claim 13, further comprising:
determining whether the signal is saturated; and
in accordance with the determination that the signal is not saturated, determining that the event corresponds to the touch event.

16. The method of claim 13, further comprising:
determining whether the amount of contact resistance corresponds to a first contact resistance; and
in accordance with the determination that the amount of contact resistance corresponds to the first contact resistance, determining that the key depression event is an initial key depression event.

17. The method of claim 16, further comprising:
determining whether the amount of contact resistance corresponds to a second contact resistance; and
in accordance with the determination that the amount of contact resistance corresponds to the second contact resistance, determining that the key depression event is a full key depression event,
wherein the first contact resistance is greater than the second contact resistance.

18. The method of claim 13, wherein the two electrodes includes a key make electrode and a first touch electrode, wherein the monitoring of the plurality of depressible keys for the touch event includes detecting a hover event using the first touch electrode, the first touch electrode located above the key make electrode.

19. The method of claim 13, wherein the two electrodes includes a key make electrode and the keyboard includes a plurality of second touch electrodes, the second touch electrodes not located underneath a plurality of domes, wherein the monitoring of the plurality of depressible keys for the touch event includes detecting a hover event using the plurality of second touch electrodes.

20. The method of claim 13, wherein the two electrodes include a key make electrode and first touch electrodes, the method further comprising:
in response to a depression of at least one of the plurality of depressible keys, contacting a corresponding key make electrode to a corresponding first touch electrode.

21. The method of claim 13, wherein the two electrodes include a key make electrode and first touch electrodes, the method further comprising:

applying an intermediate amount of force to cause an initial depression of at least one of the plurality of depressible keys; and in response to the initial depression of the at least one of the plurality of depressible keys, contacting a portion of the key make electrode to a corresponding first touch electrode.

22. The method of claim 13, wherein the two electrodes include a key make electrode and first touch electrodes, the method further comprising:

applying a full amount of force to cause a full depression of the at least one of the plurality of depressible keys; and in response to the full depression of the at least one of the plurality of depressible keys, contacting an entirety of the key make electrode to a corresponding first touch electrode.

\* \* \* \* \*